United States Patent
Kosugi et al.

(10) Patent No.: US 10,672,361 B2
(45) Date of Patent: Jun. 2, 2020

(54) METHOD, APPARATUS AND COMPUTER PROGRAM PRODUCT FOR USER DETECTION AND OPERATION CONTROL

(71) Applicant: LENOVO (Singapore) PTE. LTD., New Tech Park (SG)

(72) Inventors: Kazuhiro Kosugi, Yokohama (JP); Takuroh Kamimura, Kawasaki (JP); Hiroki Oda, Yokohama (JP); Atsushi Ohyama, Tokyo-to (JP); Yuhsaku Sugai, Yokohama (JP); Hideshi Tsukamoto, Machida (JP); Hiroyuki Uchida, Sagamihara (JP)

(73) Assignee: Lenovo (Singapore) PTE LTD, New Tech Park (SG)

( * ) Notice: Subject to any disclaimer, the term of this patent is extended or adjusted under 35 U.S.C. 154(b) by 0 days.

(21) Appl. No.: 15/599,131

(22) Filed: May 18, 2017

(65) Prior Publication Data
US 2017/0337895 A1 Nov. 23, 2017

(30) Foreign Application Priority Data
May 18, 2016 (JP) .................. 2016-099309

(51) Int. Cl.
*G09G 5/00* (2006.01)
*G06F 1/3231* (2019.01)
(Continued)

(52) U.S. Cl.
CPC ............ *G09G 5/003* (2013.01); *G01J 1/0228* (2013.01); *G01J 1/4204* (2013.01); *G01J 1/44* (2013.01); *G01J 3/12* (2013.01); *G06F 1/203* (2013.01); *G06F 1/206* (2013.01); *G06F 1/329* (2013.01); *G06F 1/3231* (2013.01); (Continued)

(58) Field of Classification Search
CPC ....................................................... G09G 5/003
See application file for complete search history.

(56) References Cited

U.S. PATENT DOCUMENTS

2009/0264161 A1 10/2009 Usher et al.
2012/0326958 A1* 12/2012 Deuel .................. G06F 3/0421
345/156

(Continued)

FOREIGN PATENT DOCUMENTS

CN 103918247 A 7/2014
CN 104484032 A 4/2015
(Continued)

*Primary Examiner* — Gustavo Polo
(74) *Attorney, Agent, or Firm* — Kunzler Bean & Adamson

(57) ABSTRACT

A method, apparatus and computer program product are disclosed. The method includes detecting ambient light around an electronic device, determining whether a user is present based on the ambient light, and controlling an operation of the electronic device. The apparatus includes a component that consumes electric power, a light sensor that detects ambient light, a frequency analyzing unit that specifies a frequency component, and a control unit that determines whether a user is present and controls an operation of the component. The computer program product includes code to perform detecting ambient light around an electronic device, determining whether a user is present based on the ambient light, and controlling an operation of the electronic device.

20 Claims, 13 Drawing Sheets

(51) Int. Cl.
  *G01J 1/44*      (2006.01)
  *G06F 1/3234*    (2019.01)
  *G06F 1/329*     (2019.01)
  *G01J 1/02*      (2006.01)
  *G01J 1/42*      (2006.01)
  *G01J 3/12*      (2006.01)
  *G06F 1/20*      (2006.01)
  *H05K 7/20*      (2006.01)
  *G01V 8/12*      (2006.01)

(52) U.S. Cl.
  CPC ............ *G06F 1/3265* (2013.01); *G09G 5/00* (2013.01); *H05K 7/20136* (2013.01); *G01V 8/12* (2013.01); *G09G 2330/022* (2013.01); *G09G 2330/023* (2013.01); *G09G 2354/00* (2013.01); *G09G 2360/144* (2013.01)

(56) References Cited

U.S. PATENT DOCUMENTS

2013/0222270 A1\*  8/2013  Winkler .............. H04M 1/0233
                                                  345/173
2015/0340875 A1\*  11/2015 Prasad .................. G06F 1/3203
                                                  307/104

FOREIGN PATENT DOCUMENTS

| JP | 01-299488     | 12/1989 |
| JP | 08-029541     | 2/1996  |
| JP | 2010-224075 A | 10/2010 |
| JP | 2011-018320 A | 1/2011  |
| JP | 2014-029662 A | 2/2014  |
| JP | 2015-180869   | 10/2015 |
| JP | 2016-212717 A | 12/2016 |

\* cited by examiner

METHOD, APPARATUS AND COMPUTER PROGRAM PRODUCT FOR USER DETECTION AND OPERATION CONTROL

CROSS-REFERENCE TO RELATED APPLICATIONS

Foreign: This patent application claims priority to Japan Patent Application No. JP2016-099309 filed on 18 May 2016 for Kosugi, et al., the entire contents of which are incorporated herein by reference for all purposes.

FIELD

The present disclosure relates to a technique for determining whether a user using an electronic equipment is present or not and a technique for controlling an operation of a device based on whether a user is present or not.

BACKGROUND

Personal electronic devices, such as laptop PCs, tablet computers and smartphones, among others, often turn off their displays after no input is made to the device for a period of time in order to reduce power consumption. However, some uses of the devices may require the screen to stay turned on even if no input is made to the device.

Such personal electronic devices often automatically adjust cooling equipment when a resource-intensive task is run, such as a schedule or background task. However, running such cooling equipment often produces noise that is annoying to the user.

BRIEF SUMMARY

A method, apparatus and computer program product are disclosed.

The method comprises detecting ambient light around an electronic device; determining whether a user is present based on a frequency component produced by a change of an intensity of ambient light; and controlling an operation of the electronic device in accordance with a result of the determination whether the user is present.

The apparatus comprises a component that consumes electric power; a light sensor that detects ambient light around the device and outputs an illumination signal; a frequency analyzing unit that specifies a frequency component produced by a change of an intensity of the illumination signal; and a control unit that determines whether a user is present based on the frequency component of the illumination signal, and controls an operation of the component.

The computer program product comprises a computer readable storage medium that stores code executable by a processor, the executable code comprising code to perform: detecting ambient light around an electronic device; determining whether a user is present based on a frequency component caused by a change of an intensity of ambient light; and controlling an operation of the electronic device in accordance with a result of the determination whether the user is present.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
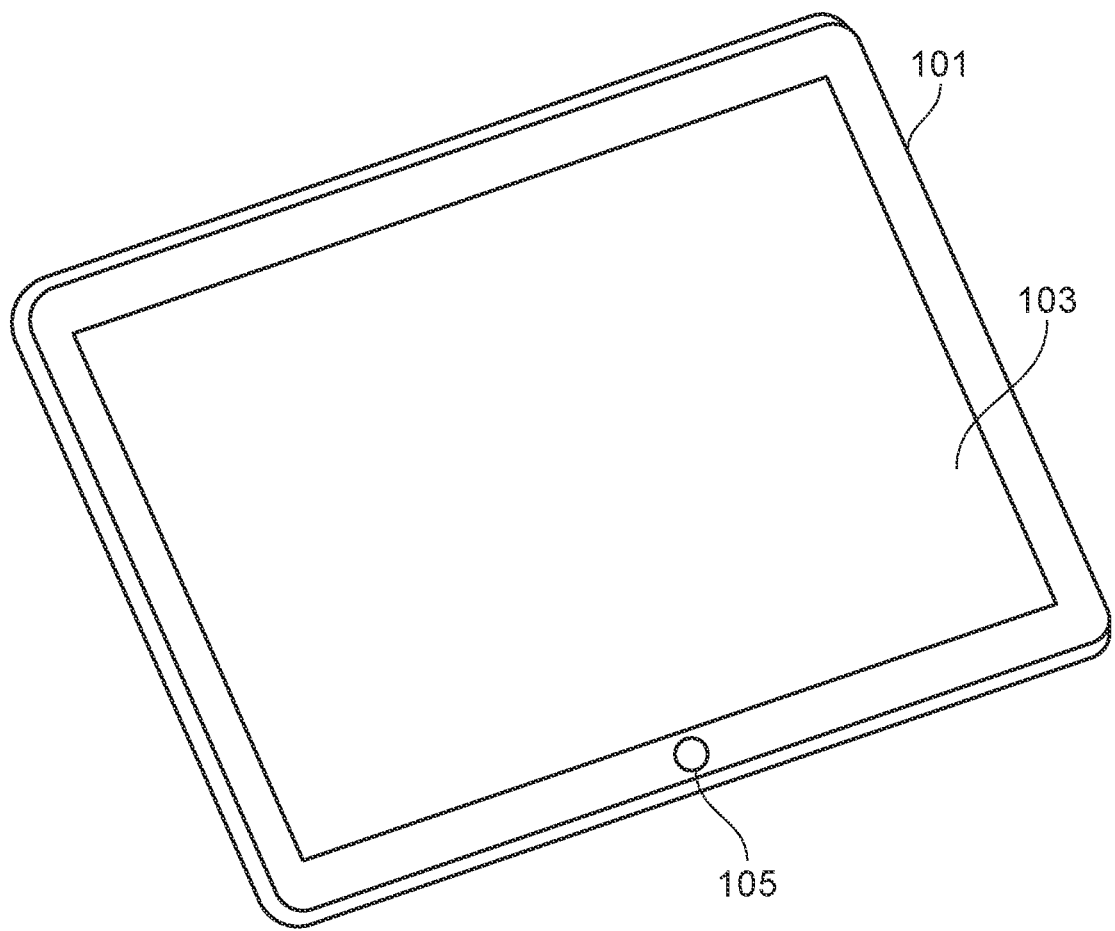
FIG. 1 illustrates an outer shape of a tablet terminal 101 as an example of an electronic equipment.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 illustrates an outer shape of a tablet terminal 101 that is an example of an electronic equipment according to this embodiment. In the tablet terminal 101, a touch screen 103 is housed in a chassis, and an illumination sensor 105 is placed on a frame. The touch screen 103 is constituted by a touch panel and a display. In the tablet terminal 101, elements unnecessary for understanding are omitted. The illumination sensor 105 converts the amount of ambient light around the tablet terminal 101 to an illumination signal for, for example, a voltage or a current, and outputs the illumination signal. The ambient light is light emitted from a luminaire or sunlight.

The illumination sensor 105 may be an ambient light sensor (ALS) included in a computer in order to adjust the luminance of a display in accordance with ambient brightness. The illumination sensor 105 may be of a type that uses a photodiode for outputting a current in accordance with the amount of incident light. The illumination signal may be, but is not limited to, the luminance, and may have a physical quantity corresponding to the intensity of light incident on the illumination sensor 105. The illumination sensor 105 may receive ambient light directly or indirectly through a filter.

Figure 2A:
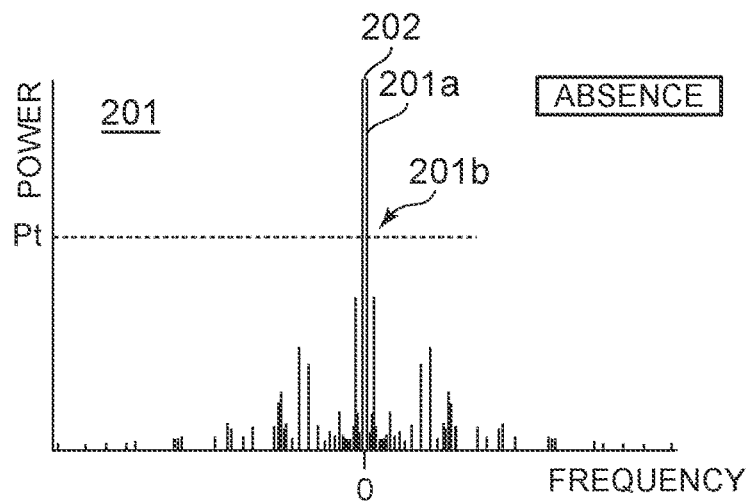
FIGS. 2A through 2C are graphs for describing a method for determining whether a user is present or not based on an illumination signal.
Figure 2B:
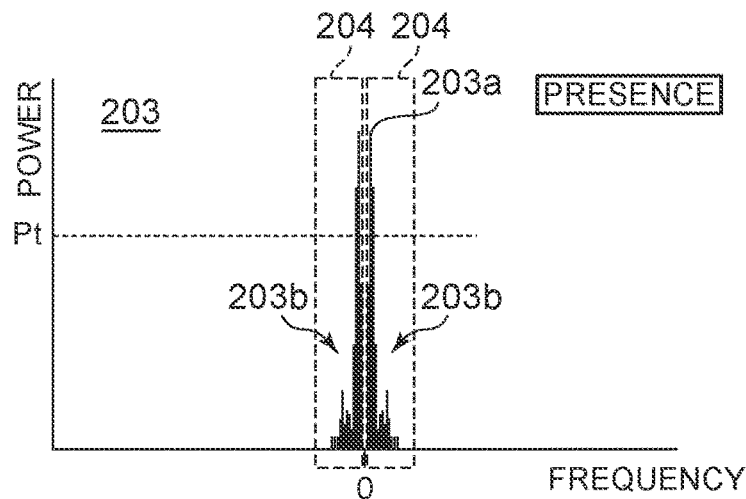
Figure 2C:
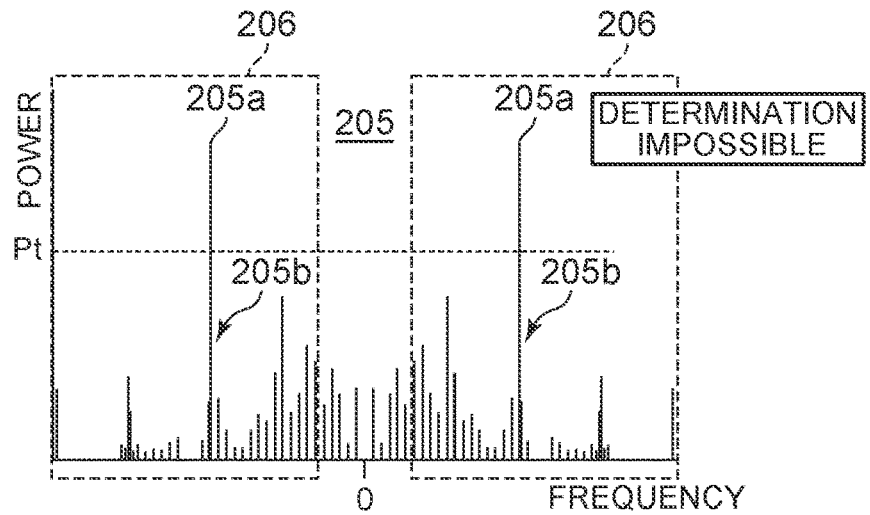

FIGS. 2A through 2C are graphs for describing a method for determining whether a user is present or not based on an illumination signal. FIGS. 2A through 2C show results of frequency analysis obtained by filtering an illumination signal output from the illumination sensor 105 with a low-pass filter and then sampling the resulting signal in a predetermined evaluation time. The ambient light is reflected on a user near the tablet terminal 101 and enters the illumination sensor 105.

The intensity of light reflected on the user and entering the illumination sensor 105 varies depending on a motion of the user. The frequency of an illumination signal to be processed in the embodiments is an alternating current component generated by a change of the intensity of the illumination signal, and is different from a frequency component corresponding to a wave length of light. A cut-off frequency of the low-pass filter is set in a range where a frequency component of noise generated in an environment around the tablet terminal 101 can be reduced. In cases where a target user slowly moves, for example, works on the desk, 10 Hz may be selected as an example of the cut-off frequency.

In each graph of FIGS. 2A through 2C, the abscissa represents the frequency and the ordinate represents power of a frequency spectrum within an extremely short frequency band corresponding to a resolution of a frequency analysis tool. The frequency spectrum is generated to be symmetric in positive and negative sides with respect to 0 Hz, in nature. FIG. 2A shows a frequency pattern 201 when a user is absent near the tablet terminal 101. Since a component of a power supply frequency included in an output of the illumination sensor 105 that has detected light of a discharge-tube luminaire is removed with the low-pass filter, most part of the frequency spectrum is a direct current component, and is concentrated around ±0 Hz.

FIG. 2B shows a frequency pattern 203 when a user is present near the tablet terminal 101. Since ambient light is reflected on a moving user and enters the illumination sensor 105, the frequency spectrum is concentrated in a narrow range around ±0 Hz in accordance with a motion of the user. FIG. 2C shows a frequency pattern 205 when the illumination sensor 105 is at a special position with respect to ambient light. The frequency pattern 205 is diverged to be wider than each of the frequency patterns 201 and 203.

The frequency pattern 205 is generated under special situations such as a situation where the tablet terminal 101 is placed on a desk while facing upward and strong ambient light is directly incident on the illumination sensor 105 from a fluorescent lamp located immediately above the tablet terminal 101. The frequency pattern 205 is not generated in a situation where a user or an object is present between the fluorescent lamp and the illumination sensor so that incident of direct light is reduced. That is, the diverged frequency pattern 205 cannot be associated with the presence or absence of the user.

To determine whether a user of the tablet terminal 101 is present or not based on the frequency patterns 201 to 205, frequency bands are set for the frequency patterns 201 to 205 with evaluation windows 202 to 206, respectively. Since the frequency spectrum is symmetric with respect to ±0 Hz, the evaluation windows 202 to 206 may be disposed at one side, but are disposed at each side of ±0 Hz in the following description. The evaluation window 202 is set as an extremely narrow frequency band that can be deemed as ±0 Hz. The frequency pattern in the absence of a user can vary depending on characteristics of the illumination sensor 105. In this case, the frequency band defined by the evaluation window 202 is set so that the absence of a user can be detected in accordance with characteristics of the illumination sensor 105.

A range in which a frequency spectrum constituting the frequency pattern 203 is concentrated varies depending on the speed of a motion of a user, such as a speed in a case where the user is working on a desk or a case where the user is exercising. The evaluation window 204 can be set outside the evaluation window 202 and within a range of about ±3 Hz, for example. The evaluation window 206 can be set outside the evaluation window 204 and inside a cut-off frequency of the low-pass filter.

Next, a method for determining whether a user is present or not by using the evaluation windows 202 to 204 will be described. In each of the frequency patterns 201 to 205, a frequency spectrum with the maximum power is defined as a maximum frequency spectrum. A threshold Pt of power is set for each of the frequency patterns 201 to 205. The threshold Pt can be set at a predetermined ratio with respect to the power of the maximum frequency spectrum in order to eliminate the influence of the intensity of ambient light. Alternatively, the threshold Pt may be set in accordance of an output of the illumination sensor 105 immediately before a frequency analysis. The threshold Pt may be dynamically changed in accordance with the intensity of ambient light. The timing of change may be at a startup of the tablet terminal, a return from a sleep state, or the time when a change of an illumination signal exceeds a predetermined level, for example.

The determination system can determine the absence of a user when the evaluation window 202 detects the maximum frequency spectrum 201a. When the evaluation window 204 detects the maximum frequency spectrum 203a, the system can determine the presence of a user. When the evaluation window 206 detects the maximum frequency spectrum 205a, the system can determine that determination on whether a user is present or not cannot be performed.

A case where none of the evaluation windows 202 and 204 detects any of the maximum frequency spectra 201a and 203a and a case where the evaluation window 206 detects the maximum frequency spectrum 205a are the same in incapability of performing determination on whether a user is present or not. It should be noted that the case of detecting the maximum frequency spectrum 205a is a case where the determination cannot be performed because of a positional relationship between a light source of ambient light and the illumination sensor 105 although the determination system normally operates. This case is different from the case where none of the evaluation windows 202 and 204 detects any of the maximum frequency spectra 201a and 203a in that the latter case also includes a case where abnormality occurs in the determination system.

The determination system can determine whether a user is present or not based on the total power of a group of continuous frequency spectra 201b to 205b respectively included in the evaluation windows 202 to 206, instead of the maximum frequency spectra 201a to 205a. For example, the determination system can determine the absence of a user when the total power of frequency spectra included in the evaluation window 202 exceeds a predetermined level with respect to the total power of all the frequency spectra. The continuous frequency spectra can be adjacent frequency spectra at frequencies less than a predetermined level.

When the total power of frequency spectra included in the evaluation window 204 exceeds a predetermined level with respect to the total power of all the frequency spectra, the system determines the presence of a user, whereas when the total power of frequency spectra included in the evaluation window 206 exceeds a predetermined level, the system determines that the determination cannot be performed. The incapability of performing the determination can be determined by using an index indicating variations of, for example, a dispersion or a standard deviation of frequency spectra whose power is a predetermined level or more. The evaluation windows 202 to 206 may be applied only to frequency spectra whose peaks are larger than the threshold Pt, instead of continuous frequency spectra.

Figure 3A:
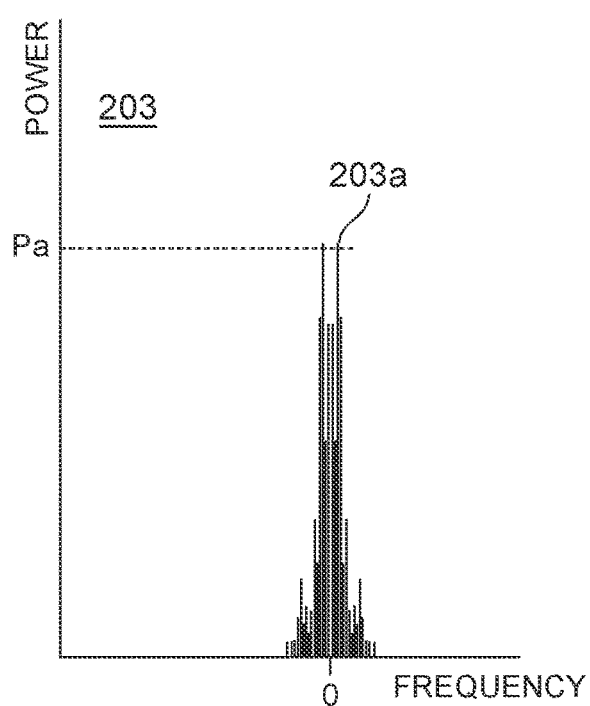
FIGS. 3A and 3B are graphs for describing a method for estimating a distance from the tablet terminal 101 to a user.
Figure 3B:
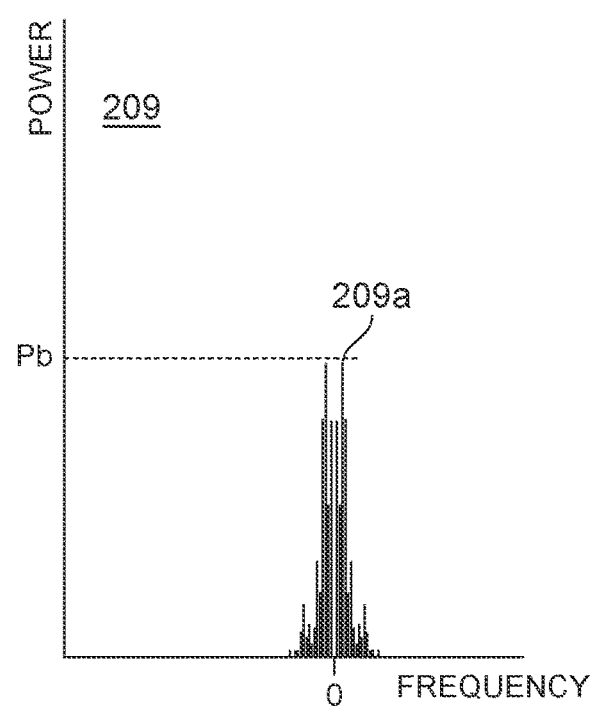

FIGS. 3A and 3B are graphs for describing a method for estimating a distance from the tablet terminal 101 to a user. FIG. 3A shows a frequency pattern 203 when a user is present at a location at which the user actually uses the tablet terminal 101, such as a distance of 70 cm or less from the tablet terminal 101 to the user. FIG. 3B shows a frequency pattern 209 when a user is located away from the tablet terminal 101.

A maximum frequency spectrum 209a of the frequency pattern 209 has a power Pb lower than a power Pa of the maximum frequency spectrum 203a of the frequency pattern 203. Since frequency spectra are generated from light reflected on a moving user, independently of the distance to the user, the distance to the user can be estimated from the powers Pa and Pb. As an example, the distance to a user corresponding to the power Pa is defined as a reference distance, and a distance to the user with respect to the frequency pattern 209 is estimated from the power Pa, the power Pb, and the reference distance. The reference distance is a typical distance when a user performs a touch operation on the tablet terminal 101, and the power Pa corresponding to the reference distance can be calculated at the timing when the user performs a touch operation.

Figure 4:
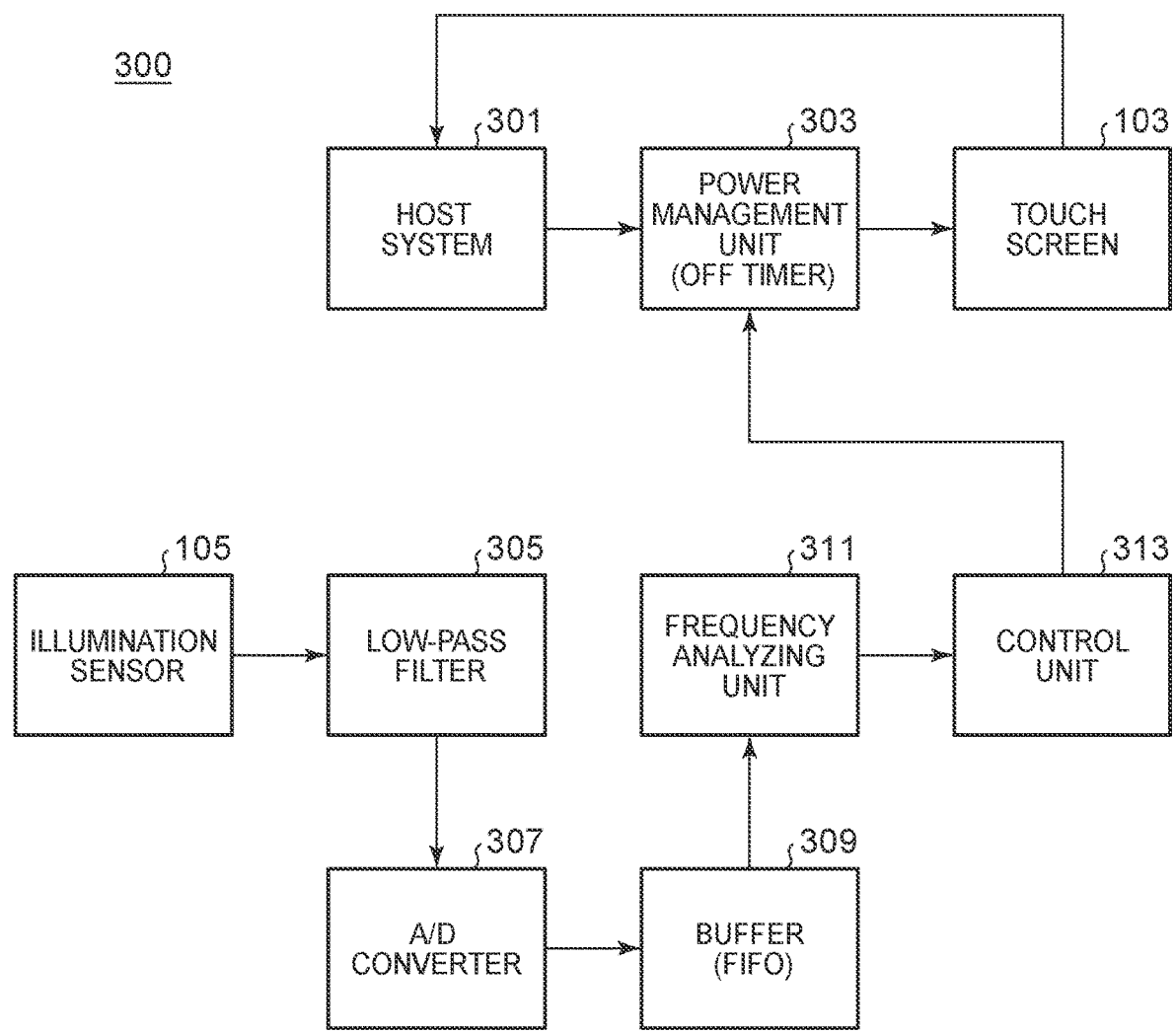
FIG. 4 is a functional block diagram generally illustrating a display control system 300 provided in the tablet terminal 101.

FIG. 4 is a functional block diagram generally illustrating a display control system 300 provided in the tablet terminal 101. The display control system 300 includes the illumination sensor 105, a low-pass filter 305, an A/D converter 307, a buffer 309, a frequency analyzing unit 311, and a control unit 313. The display control system 300 also includes a known host system 301, a power management unit 303, and the touch screen 103.

The host system 301, the power management unit 303, the frequency analyzing unit 311, and the control unit 313 can be constituted by hardware such as a CPU, a system memory, and an I/O device constituting the tablet terminal 101 and software such as an OS, a device driver, and an application program. The host system 301 outputs an idle event to the power management unit 303 when detecting an idle state based on a CPU activity ratio.

The host system 301 outputs an active event to the power management unit 303 when detecting a touch operation on the touch screen 103 or an input from another I/O device. The power management unit 303 includes an off timer that measures an idle time when receiving an idle event. The power management unit 303 stops a timer operation when receiving an active event. The power management unit 303 stops display of the touch screen 103 when a predetermined time has elapsed so that the off timer turns on.

The frequency analyzing unit 311 outputs, to the control unit 313, a frequency spectrum generated by a fixed-length data block taken from the buffer 309. The frequency analyzing unit 311 is not limited to a specific configuration, and may be software for a numerical analysis created by using a programming language of MATLAB, for example.

The control unit 313 includes a program for determining whether a user is present or not based on the evaluation windows 202 to 204, the threshold Pt, and the frequency spectra shown in FIGS. 2A through 2C. The control unit 313 has the power Pa (see FIG. 3A) of the maximum frequency spectrum corresponding to the reference distance. The control unit 313 sends a reset event for resetting the off timer to the power management unit 303 when determining the presence of a user of the tablet terminal 101. The reset event corresponds to the active event output from the host system 301 in terms of resetting the off timer.

Figure 5:
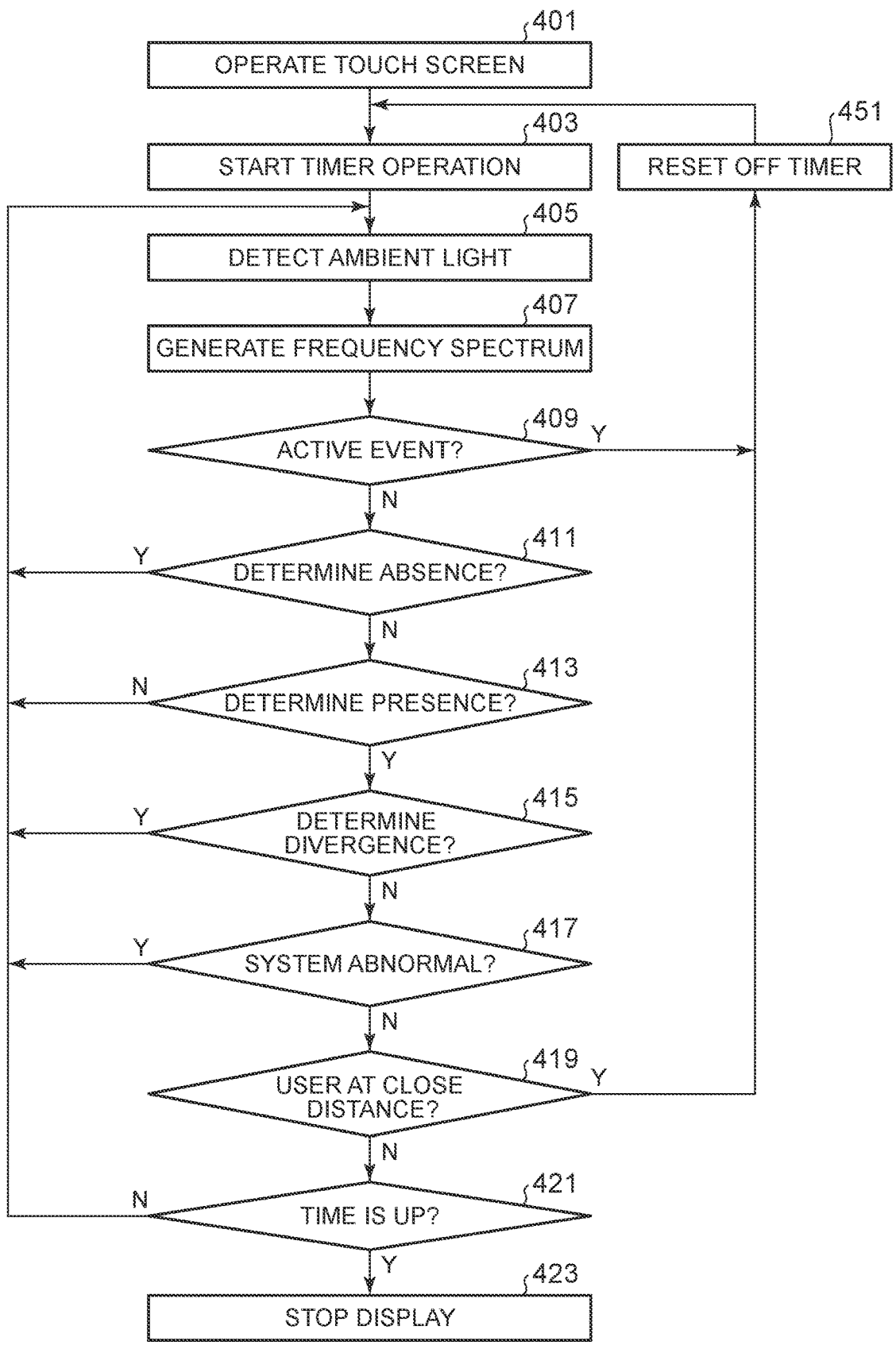
FIG. 5 is a flowchart depicting an operation of the display control system 300.
Figure 6:
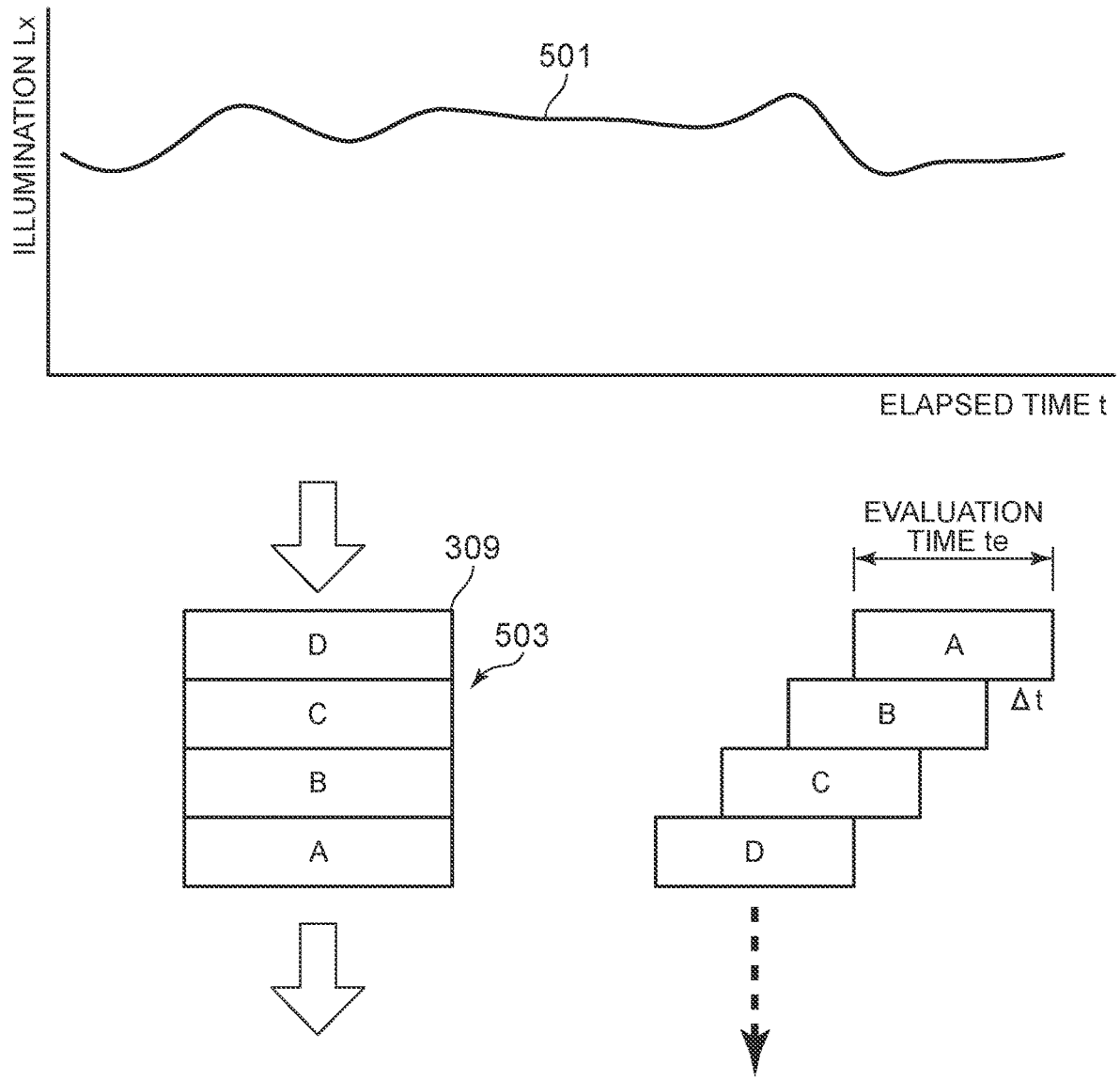
FIG. 6 illustrates how a frequency analyzing unit 311 generates a frequency spectrum.

FIG. 5 is a flowchart depicting an operation of the display control system 300. In block 401, the touch screen 103 operates. In block 403, the power management unit 303 starts measuring an idle time of the host system 301. In block 405, the illumination sensor 105 detects ambient light and outputs an illumination signal. In block 407, the frequency analyzing unit 311 generates a frequency spectrum from the illumination signal. FIG. 6 illustrates how the frequency analyzing unit 311 generates a frequency spectrum.

An illumination signal 501 output from the low-pass filter 305 is converted by an A/D converter to a digitized fixed-length data block 503 (A, B, C, . . . ) at each evaluation time te, and the converted signals are stored in the buffer 309 by a FIFO method. An evaluation time te for generating one data block 503 needs to be greater than or equal to a time sufficient for effectively performing a frequency analysis, and the length is selected in a range in which responsiveness of the display control system 300 is not impaired.

In block 407, the frequency analyzing unit 311 sequentially takes data blocks from the buffer 309, generates frequency spectra, and outputs the frequency spectra to the control unit 313. The timing of a frequency analysis of each data block is delayed in terms of time by Δt (Δt <te). When the host system 301 generates an active event in block 409, the process proceeds to block 451. In block 451, the power management unit 303 resets the timer operation of the off timer.

If the host system 301 does not generate an active event, the process proceeds to block 411, and the timer operation of the off timer progresses. In block 411, if the control unit 313 determines the absence of a user, the process returns to block 405, or otherwise, the process proceeds to block 413. In block 413, if the control unit 313 determines the presence of a user, the process proceeds to block 415, or otherwise, the process returns to block 405.

In block 415, if the control unit 313 determines divergence of a frequency pattern, the process returns to block 405, or otherwise, the process proceeds to block 417. In block 417, if the control unit 313 determines abnormality of the display control system 300, the process returns to block 405, or otherwise, the process proceeds to block 419. In block 419, the control unit 313 estimates a distance to a user based on the levels of powers Pa and Pb (FIGS. 3A and 3B).

If the control unit 313 determines that a user is at a close distance and uses the tablet terminal 101, the process proceeds to block 451, whereas if the control unit 313 determines that a person is at a long distance and is estimated to be a person not using the tablet terminal 101, the process proceeds to block 421. At block 451, when the control unit 413 sends a reset event to the power management unit 303, the power management unit 303 resets the timer operation of the off timer.

Thus, as long as the presence of a user who is estimated to use the tablet terminal 101 is determined, the display does not stop even without a touch operation. For this reason, this configuration is convenient for a case where the tablet terminal 101 is used in a browsing mode. In addition, since the setting of the power management unit 303 does not need to be changed, when the control unit 313 determines that a user is absent, the di splay stops.

In block 421, the power management unit 303 that operates independently of the control unit 311 stops display in block 423 when a predetermined time has elapsed so that the off timer turns on. If a predetermined time has not elapsed, the process returns to block 405. The process reaches block 423 only in a case where the display control system 300 continuously determines the absence of a user near the tablet terminal 101 until the predetermined time has elapsed so that the off timer turns on.

Figure 7:
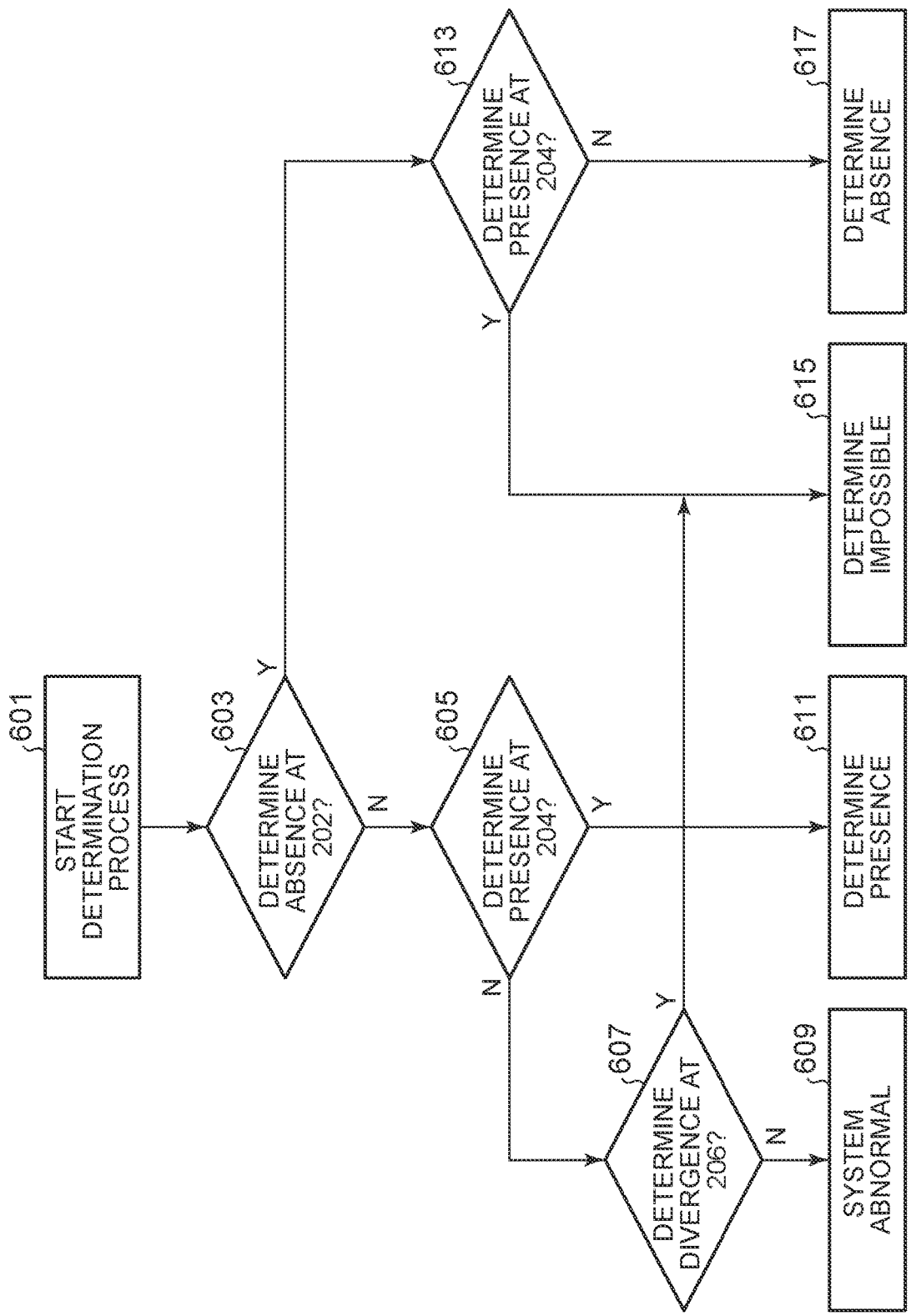
FIG. 7 is a flowchart for describing an example of procedures of blocks 411 to 417 in FIG. 5.

FIG. 7 is a flowchart for describing procedures from block 411 to block 417 in detail. In block 601, the control unit 311 applies the evaluation window 202 to the maximum frequency spectrum 201a or the frequency spectrum group 201b for the frequency pattern of the data block 503. If the absence of a user is determined, the process proceeds to block 613, or otherwise, the process proceeds to block 605. At the time when the process proceeds to block 613, the control unit 311 can determine the absence of a user. This determination might include a type II error (false positive).

In this case, in block 613, the control unit 313 applies the evaluation window 204 for a frequency pattern in the same data block. If the control unit 313 determines the presence of a user, the process proceeds to block 615, or otherwise, the process proceeds to block 617. Block 617 is reached when the absence of a user is determined in block 603 and the presence of a user is not determined in block 613. At this time, the control unit 313 that obtained matching results can accept determination in block 603.

An error that might occur in block 603 is reduced in block 613. Block 615 is reached when the absence of a user is determined in block 603 and the presence of a user is determined in block 613. At this time, the control unit 313 that obtained contradictory results can determine determination on a user cannot be performed. In block 605, the control unit 313 applies the evaluation window 204 for a frequency pattern in the same data block. If the control unit 313 determines the presence of a user, the process proceeds to block 611, or otherwise, the process proceeds to block 607.

The control unit 313 may determine the presence of a user in block 611 based on only the result in block 605. This determination, however, includes a type II error (false positive). In a state where the absence of a user is not determined in block 603 and the presence of a user is determined in block 605, the control unit 313 that has obtained matching results can accept determination in block 605 so that the error can be reduced.

Transition to block 607 corresponds to a state where neither the presence nor the absence of a user is determined. This case corresponds to abnormality of the display control system 300 or divergence of a frequency spectrum. The control unit 313 applies the evaluation window 206 for a frequency pattern in the same data block. If the control unit 313 determines divergence of a frequency spectrum, the process proceeds to block 615, or otherwise, the process proceeds to block 609. The transition to block 609 is a state in which none of the frequency patterns 201 to 205 is determined, and the control unit 313 determines that the illumination sensor 105, the frequency analyzing unit 311, or another component is abnormal.

In FIG. 7, it is determined whether a user is present or not based on the data block 503 generated at every evaluation time te, but the determination may be performed based on a plurality of data blocks 503. For example, the control unit 313 may determine the presence or absence of a user only if determination results on the data blocks 503 match each other, and if data blocks showing contradictory results are included, the control unit 313 may determine that the determination cannot be performed.

In the flowchart of FIG. 5, the order of the procedures of the elements is an example and the elements may be replaced or omitted as long as equivalent functions can be obtained. For example, blocks 411 to 417 may be replaced to an arbitrary order. The procedure of block 409 is not limited to a specific order because the host system 301 operates independently of an operation of the control unit 313. All or a part of the procedures of blocks 411, 415, 417, 419, 603, 613, 607, 609, and 615 may be omitted.

Figure 8:
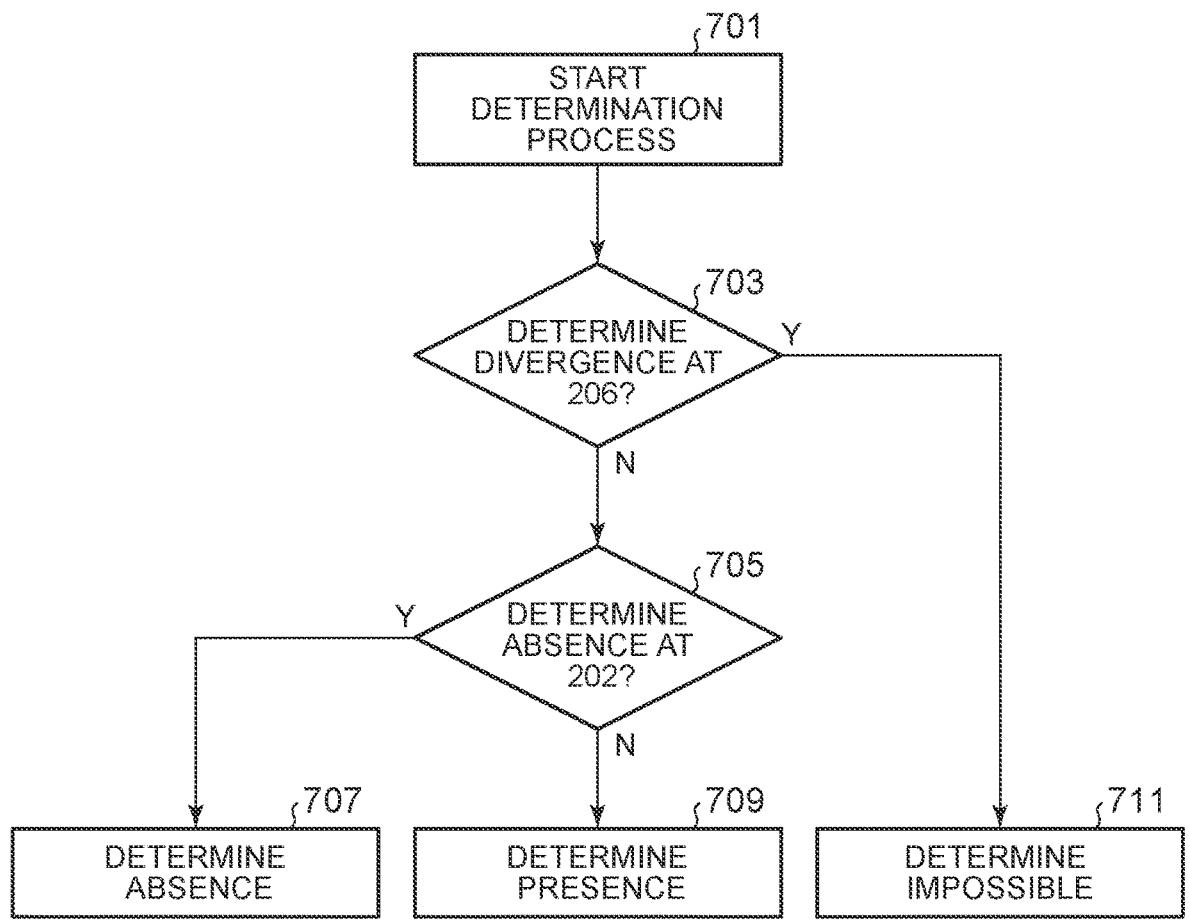
FIG. 8 is a flowchart for describing an example of procedures of blocks 411 to 415 in FIG. 5.

FIG. 8 is a flowchart for describing an example of procedures of blocks 411 to 415 in FIG. 5. In a case where the frequency pattern can be expected to be certainly one of the three patterns as illustrated in FIG. 2, determination of one of the presence or the absence and determination of the other based on determination of divergence can be performed. FIG. 8 shows the case of using determination of the absence and determination of divergence.

In block 703, the control unit 313 uses the evaluation window 206, and if divergence is determined, it is determined that determination cannot be performed in block 711. If divergence is not determined, the process proceeds to block 705. In block 705, the control unit 313 uses the evaluation window 202, and if the absence is determined, the process proceeds to block 707, or otherwise, the process proceeds to block 709. The control unit 313 determines the absence in block 707, and determines the presence in block 709.

Figure 9:
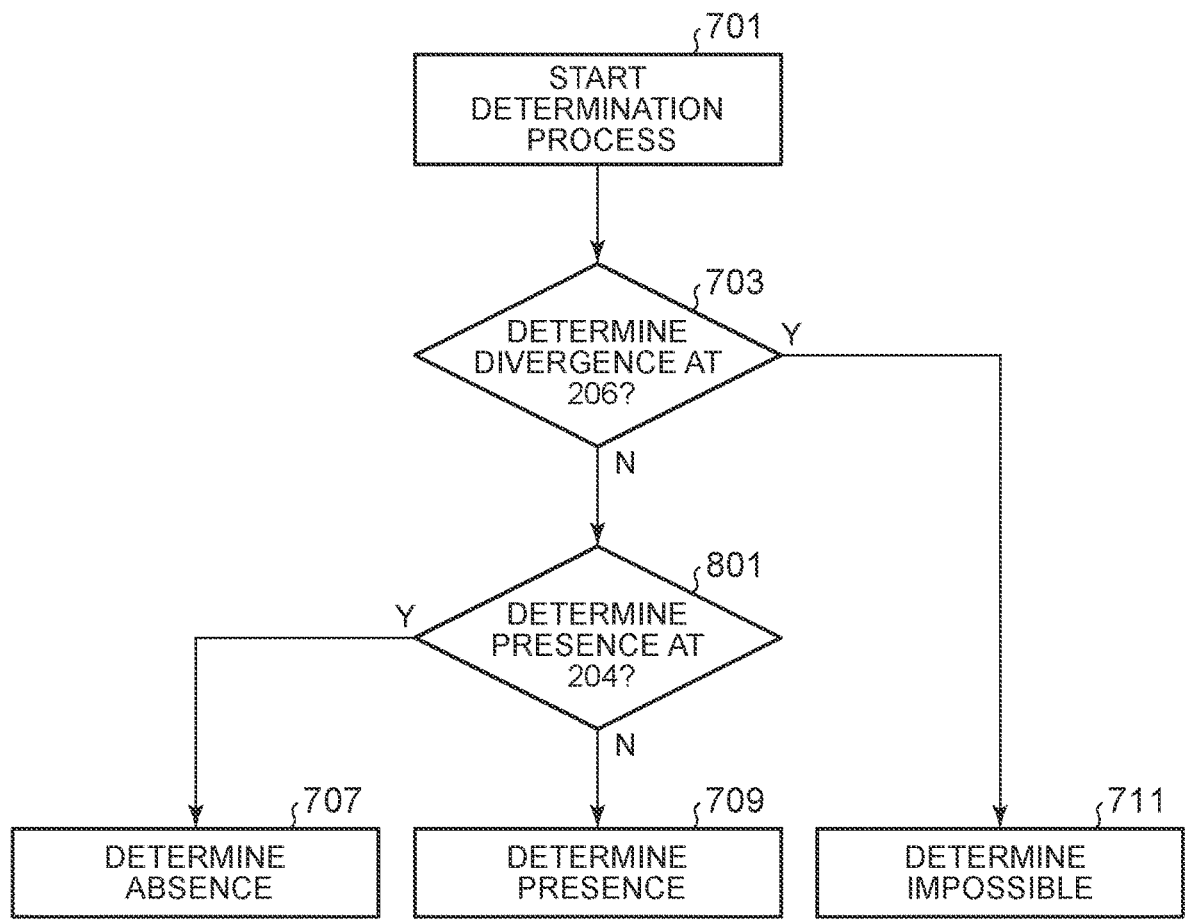
FIG. 9 is a flowchart for describing other procedures of blocks 411 to 415 in FIG. 5.

FIG. 9 is a flowchart for describing other procedures of blocks 411 to 415 in FIG. 5. The procedures in FIG. 9 are different from those in FIG. 8 in using determination of the presence and determination of divergence. In the procedures in FIG. 9, the evaluation window 202 is replaced by an evaluation window 204 for determination of the presence in block 801.

Figure 10:
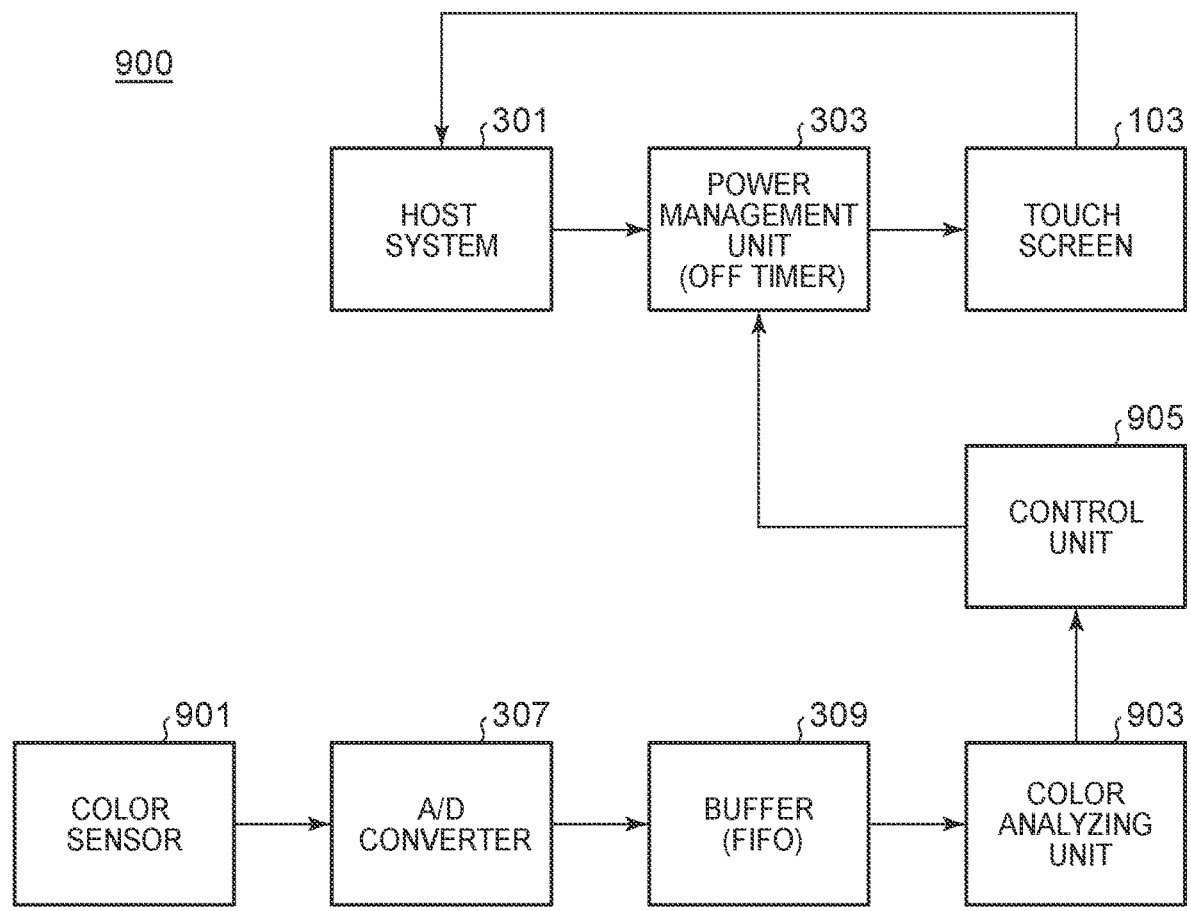
FIG. 10 is a functional block diagram generally illustrating a display control system 900 provided in the tablet terminal 101.

FIG. 10 is a functional block diagram generally illustrating the display control system 900 provided in the tablet terminal 101. In FIG. 10, elements also shown in FIG. 4 or easily assumed from the elements shown in FIG. 4 are denoted by the same reference numerals, and description thereof will not be repeated. A color sensor 901 generates illumination signals for primary colors (red, green, and blue) from incident ambient light, and outputs the illumination signals. The color sensor 901 is not limited to a specific principle of generating primary colors, and may be constituted by red, green, and blue filters and photo transistors. A color analyzing unit 903 outputs a hue calculated from the intensity of light of a primary color. When the control unit 905 detects the color of skin of a human from the hue of ambient light, the control unit 905 determines the presence of a user and outputs a reset event to the power management unit 303.

Figure 11:
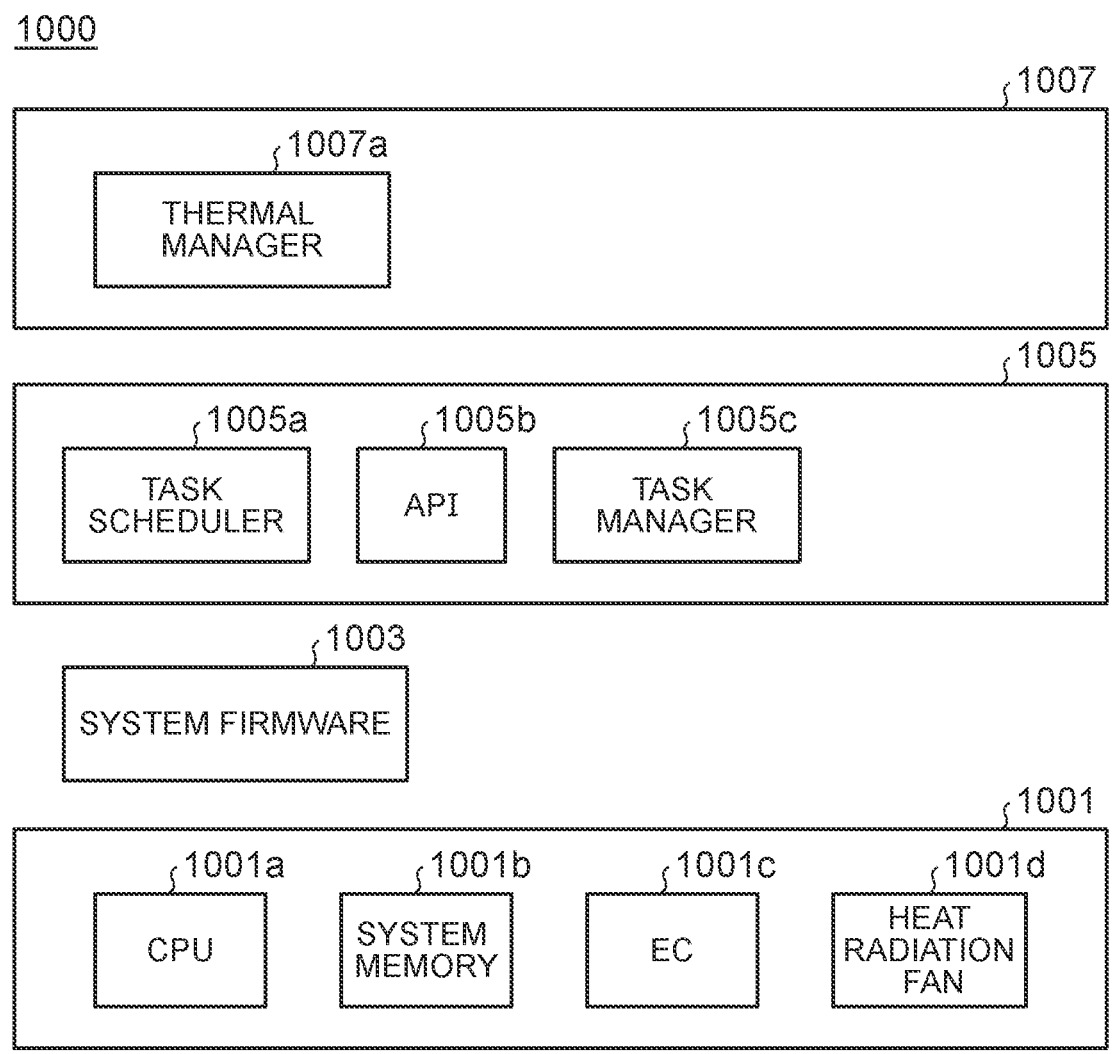
FIG. 11 is a functional block diagram for describing another example employing a method for determining whether a user is present or not.

FIG. 11 is a functional block diagram for describing another example employing a method for determining whether a user is present or not. FIG. 11 illustrates configurations of hardware and software of a laptop PC 1000. FIG. 11 shows only elements necessary for understanding this example. Hardware 1001 includes a central processing unit (CPU) 1001*a*, a system memory 1001*b*, an embedded controller (EC) 1001*c*, and a heat radiation fan 1001*d*.

The CPU 1001*a* executes an OS 1005, a system firmware 1003, and an application 1007, for example, and also has a monitoring control function for keeping the temperature at a predetermined value or less. When the system firmware 1003 enables the temperature monitoring control function, the CPU 1001*a* monitors the core temperature so that when a load increases to cause a temperature rise, the CPU 1001*a* reduces an operating frequency and an operating voltage or performs an intermittent operation to reduce the temperature. In an example, Intel Corporation (Intel: registered trademark) provides a CPU in which the temperature monitoring control function is incorporated in a thermal control circuit (TCC). The embodiments may also employ a CPU manufactured by another manufacturer providing the temperature monitoring control function. Instead of the temperature monitoring control function, the EC 1001*c* may adjust one or both of the voltage and the frequency of the CPU 1001*a* to control the temperature.

EC 1001*c* is a microcomputer that executes a firmware independently of the CPU 1001*a* to control the temperature and power of the laptop PC 1000. The EC 1001*c* has a policy concerning a unique thermal management, and monitors temperatures of main components in the chassis including the CPU 1001*a* and the chassis surface to control a rotation speed of the heat radiation fan 1001*d*. To achieve the thermal management, the EC 1001*c* sets the temperature monitoring control function in the CPU 1001*a* through the system firmware 1003.

The heat radiation fan 1001*d* exhausts high-temperature air to the outside the chassis to radiate heat by using a combination of heat sinks as necessary. The EC 1001*c* changes the rotation speed of the heat radiation fan 1001*d* depending on the internal temperature. As the internal temperature increases, the rotation speed of the heat radiation fan 1001*d* increases and noise increases. The OS 1005 includes a task scheduler 1005*a*, an API 1005*b*, and a task manager 1005*c*, for example.

The task scheduler 1005*a* has the function of executing a program (task) at predetermined time, day of the week, or time interval, for example, that has been set. The task set by the task scheduler 1005*a* will be referred to as a schedule task. Schedule tasks include scanning of whether update of a program is necessary or not, virus checking, inspection of a system state, and the like. Many schedule tasks are set so that execution timings thereof are set in the task scheduler 1005*a* at the installation.

The task scheduler 1005*a* registers many schedule tasks so that the schedule tasks are executed while the system is idle. The task scheduler 1005*a* can execute a schedule task that was shut down halfway through execution or could not be executed at a set time, in an idle state immediately after next startup in some cases. A user can set the timing of executing a schedule task in the task scheduler 1005*a* but this job is complicated and requires knowledge of computers.

The API 1005*b* provides a command and a function for the application 1007 to use services of the OS 1005. The task manager 1005*c* monitors the activity ratio of the CPU 1001*a*. The application 1007 includes a thermal manager 1007*a*. The thermal manager 1007*a* constitutes the control unit 313 (see FIG. 4) for determining whether a user is present or not in corporation with the OS 1005 and the hardware 1001.

Figure 12:
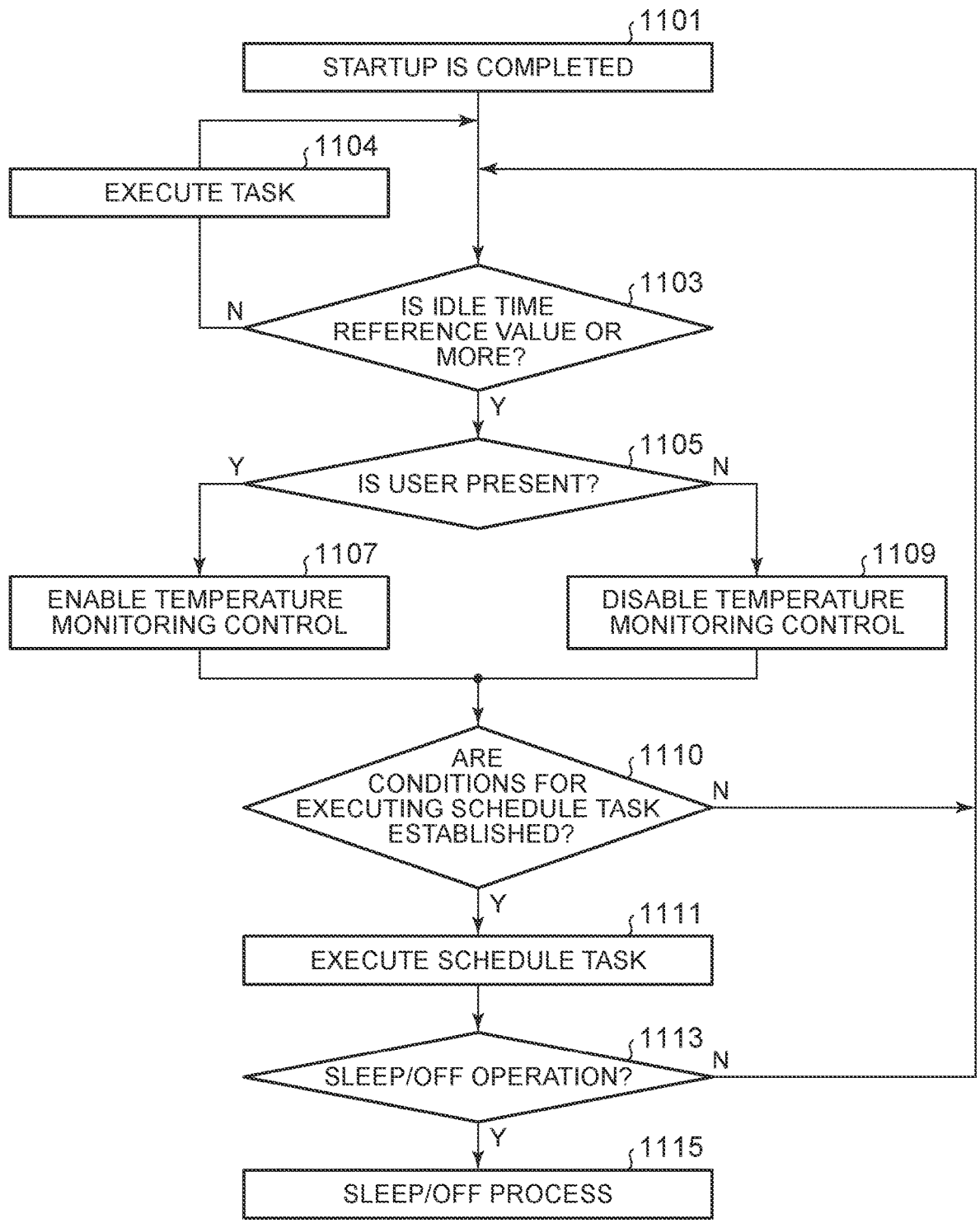
FIG. 12 is a flowchart for describing procedures of setting a temperature monitoring control function of a CPU 1001c.

FIG. 12 is a flowchart for describing procedures of determining whether a user is present or not and setting the temperature monitoring control function of the CPU 1001*a* in order to solve the problem of noise generated by the heat radiation fan 1001*d*. Based on a thermal management policy, the EC 1001*c* sets the temperature monitoring control function of the CPU 1001*a*, and controls the rotation speed of the heat radiation fan 1001*d*. When the temperature monitoring control function is set to enable, operation performance of the CPU 1001*a* degrades. Thus, in an example, the EC 1001*c* disables the temperature monitoring control function until the rotation speed of the heat radiation fan 1001*d* reaches its maximum.

While a user task is being executed, the amount of heat generation is relatively small and the rotation speed of the heat radiation fan 1001*d* is low. Thus, a user does not feel noise, or even when the rotation speed of the heat radiation fan 1001*d* increases, a user feels that the noise is normal noise caused by using the computer. When the idle state of the system continues for a predetermined time, many schedule tasks are executed and the temperature of the CPU 1001*a* increases. When the temperature in the chassis including the CPU 1001*a* increases, the EC 1001*c* increases the rotation speed of the heat radiation fan 1001*d* accordingly.

In an example, in a case where the temperature rise continues after the rotation speed of the heat radiation fan 1001*d* reaches its maximum, the EC 1001*c* enables the temperature monitoring control function of the CPU 1001*a*, for example. When the temperature monitoring control function is enabled, the amount of heat generation by the CPU 1001*a* decreases accordingly. Thus, the EC 1001*c* reduces the rotation speed of the heat radiation fan 1001*d*. At this time, until the rotation speed decreases, the heat radiation fan 1001*d* rotates at the maximum speed and generates noise. A user feels a sense of incongruity in noise generated without any access to the laptop PC 1000.

A boot is completed at block 1101. In block 1103, the thermal manager 1007*a* recognizes, as an idle state, a state in which a CPU activity ratio acquired from the task manager 1005*c* is a predetermined level or less. The thermal manager 1007*a* calculates an idle time and compares the calculated idle time with a reference value. When a user task such as an input by a user or reproduction of streaming data is executed at block 1104, the idle time less than the reference value is maintained. In some operating state of the system, although the rotation speed of the heat radiation fan 1001*d* might increase, this increase is caused by using the laptop PC 1000, and thus, a user can consider that the noise is within an estimated range. When the idle time exceeds the reference value, the process proceeds to block 1105.

The reference value of the idle time is selected at a value with which a schedule task is not automatically executed. In block 1105, the thermal manager 1007*a* determines whether a user is present or not based on procedures shown in FIGS. 5 through 9. If it is determined that a user is present, the thermal manager 1007*a* enables the temperature monitoring control function at block 1107, whereas if it is determined that a user is absent, the thermal manager 1007*a* disables the temperature monitoring control function at block 1109.

When the idle time further continues and conditions for executing a schedule task are established at block 1110, the task scheduler 1005*a* executes a schedule task at block 1111. The laptop PC 1000 returns block 1103 and continues an operation until the execution conditions are established. The EC 1001*c* controls the rotation speed of the heat radiation fan 1001*d* in accordance with the amount of heat generation of the CPU 1001*a* and other devices. At this time, the CPU 1001*a* executing a predetermined task operates with low operation performance in the presence of a user, and thus, the amount of heat generation is small. On the other hand, in the absence of a user, the CPU 1001*a* operates with high operation performance, and thus, the amount of heat generation is large.

Consequently, while a user is near the laptop PC 1000 and does not perform an input, the heat radiation fan 1001*d* operates at a low operation speed. While no user is near the laptop PC, the heat radiation fan 1001*d* operates at a high operation speed. When an operation of a shift to a sleep state or a power-off state is performed at block 1113, this process is performed at block 1115. As long as a power-on state is maintained, the process returns to block 1103, and the temperature monitoring control function is set based on whether a user is present or not.

Figure 13:
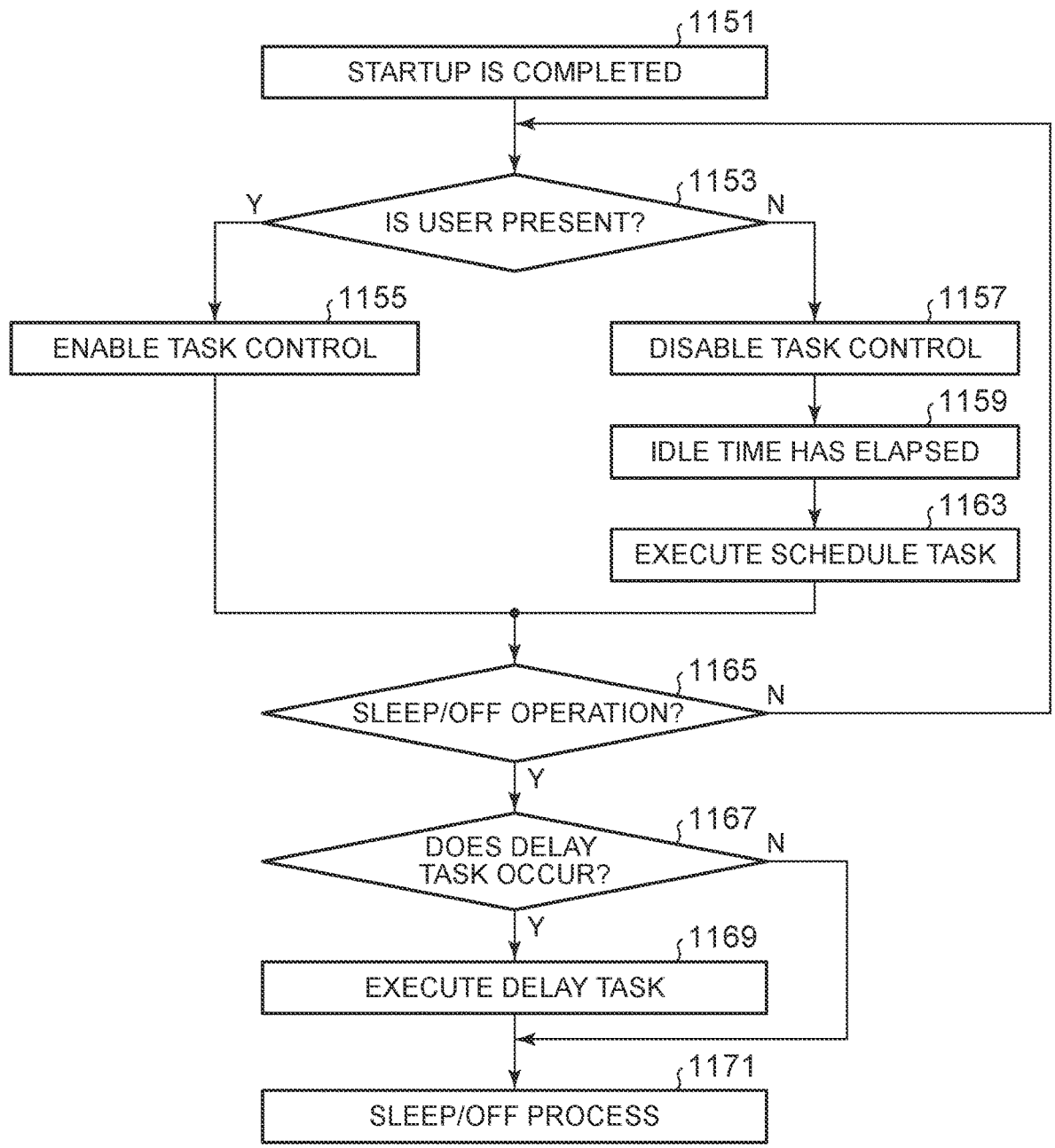
FIG. 13 is a flowchart for describing procedures of controlling the timing of executing a task.

FIG. 13 is a flowchart for describing procedures of determining whether a user is present or not and controlling the timing of executing a schedule task in order to solve the problem of noise generated by the heat radiation fan 1001*d*. At block 1151, startup of the laptop PC 1000 is completed. At block 1153, the thermal manager 1007*a* determines whether a user is present or not based on the procedures shown in FIGS. 5 through 9.

If it is determined that a user is present, the task manager 1007*a* enables task control at block 1155, whereas if it is determined that a user is absent, the task manager 1007*a* disables the task control at block 1157. The task control corresponds to a process for temporarily stopping the timing of executing a schedule task by the thermal manager 1007*a*. As one method, the thermal manager 1007*a* generates a dummy process that is regularly executed to suppress a shift of the CPU 1001*a* to the idle state.

As another method, the thermal manager 1007*a* stops a schedule task registered in the task scheduler 1005*a*. Thus, while the task manager 1007*a* enables task control, no schedule task is executed, and thus, the heat radiation fan 1001*d* does not rotate at a high operation speed unless a user task with a heavy load is executed. If the idle time exceeds a predetermined value at block 1159, a schedule task is executed at block 1163. Consequently, although the heat radiation fan 1001*d* operates at a high operation speed, the problem of noise does not arise because no user is present nearby.

The laptop PC 1000 returns to block 1153 and operates until a shift operation to a sleep state or a power-off state is performed at block 1165. If a time in which task control is enabled is long, a schedule task (delay task) that is not executed at the time of the shift operation occurs. The thermal manager 1007*a* inquires at the task scheduler 1005*a* at block 1167 and, when recognizing the presence of the delay task, disables task control at block 1169. After the delay task is executed, the process proceeds to block 1171.

If a schedule task is executed before a user uses the laptop PC, processes of a user task by the CPU 1001*a* become slow. In the procedure shown in FIG. 13, execution of overlapping part between the user task and the schedule task can be avoided. Since execution of the schedule task is suppressed in the presence of a user, the user can use the laptop PC 1000 with comfort. The device that executes the procedures of block 1105 in FIG. 12 and block 1153 in FIG. 13 of determining whether a user is present or not is not limited to an ambient light sensor, and may be a human presence sensor or an IR camera.

Although the foregoing description is directed to a specific embodiment illustrated in the drawings, the present disclosure is not limited to the illustrated embodiment and, of course, any known configuration may be employed as long as advantages of the embodiments can be obtained. In the present disclosure, a target device is not limited to a display or a processor.

In the foregoing examples, an operation of the display, the temperature monitoring control function of the CPU, and the task control function of the OS were described as control methods. The embodiments are also applicable to a shift to an operation mode such as a sleep state in which power consumption is reduced in the absence of a user. An object of the device control is not limited to the examples described here, and is used for all the applications in which control performed in association with the presence or absence of a user is useful.

DESCRIPTION OF SYMBOLS

101: tablet terminal
105: illumination sensor
201, 203, 205: frequency pattern
201*a*, 203*a*, 205*a*: maximum frequency spectrum
201*b*, 203*b*, 205*b*: frequency spectrum group
202, 204, 206: evaluation window
300: display control system
503: data block
1000 laptop PC
1001 hardware
1005 OS
1007 application Embodiments may be practiced in other specific forms. The described embodiments are to be considered in all respects only as illustrative and not restrictive. The scope of the present disclosure is, therefore, indicated by the appended claims rather than by the foregoing description. All changes which come within the meaning and range of equivalency of the claims are to be embraced within their scope.

What is claimed is:

1. A method, comprising:
    detecting ambient light around an electronic device;
    determining whether a user is present based on a frequency component produced by a change of an intensity of ambient light; and
    controlling an operation of the electronic device in accordance with a result of the determination whether the user is present, comprising
        enabling temperature monitoring control as a result of determining that the user is present, and
        disabling temperature monitoring control as a result of determining that the user is not present.

2. The method of claim 1, wherein determining whether a user is present comprises:
    generating a frequency spectrum of the ambient light.

3. The method of claim 1, wherein determining whether a user is present comprises:
    determining whether a user is present based on a frequency band that includes a representative spectrum selected from frequency spectra of the ambient light that are continuous in a predetermined time period.

4. The method of claim 3, wherein the representative spectrum comprises a frequency spectrum with a maximum power.

5. The method of claim 3, wherein the representative spectrum is a group of continuous frequency spectra.

6. The method of claim 3, wherein:
    it is determined that the user is absent if the representative spectrum is in a first frequency band around 0 Hz.

7. The method of claim 3, wherein:
    it is determined that the user is present if the representative spectrum exceeds a first frequency band, and
        is located in a second frequency band less than a predetermined frequency.

8. The method of claim 7, wherein:
    it is determined that a determination whether a user is present can be performed if the representative spectrum is in a range greater than or equal to the second frequency band.

9. The method of claim 1, further comprising:
    estimating a distance from the electronic device to the user based on power of a frequency spectrum of the ambient light;
    wherein it is determined that a user is present if the distance to the user is less than a predetermined value.

10. The method of claim 1, wherein controlling the operation of the device comprises:
    controlling operation of a central processing unit.

11. The method of claim 1, wherein controlling the operation of the device comprises:
    controlling execution of a schedule task by a central processing unit.

12. The method of claim 11, wherein controlling the operation of the device further comprises:
    preventing a shift of the central processing unit to an idle state if it is determined that the user is present.

13. An apparatus comprising:
    a component that consumes electric power;
    a light sensor that detects ambient light around the apparatus and outputs an illumination signal;
    a frequency analyzing unit that specifies a frequency component produced by a change of an intensity of the illumination signal;
    a control unit that
        determines whether a user is present based on the frequency component of the illumination signal,
        controls an operation of the component,
        enables a temperature monitoring control as a result of the control unit determining that a user is present, and
        disables the temperature monitoring control as a result of the control unit determining that a user is not present.

14. The apparatus of claim 13, wherein:
    the control unit determines whether a user is present based on a pattern of a frequency spectrum generated by the frequency analyzing unit.

15. The apparatus of claim 13, further comprising:
    a power management unit that
        begins a timer operation after a system enters an idle state, and
        stops the component after the timer operation reaches a predetermined amount of time;
    wherein the control unit restarts the timer operation of the power management unit if the control unit determines that a user is present.

16. The apparatus of claim 13, wherein the component comprises a display.

17. The apparatus of claim 13, wherein the component comprises a central processing unit.

18. The apparatus of claim 13, wherein the control unit:
    controls schedule task execution based on a result of the determination whether the user is present.

19. The apparatus of claim 18, wherein the control unit:
    controls schedule task execution by causing a central processing unit to execute a dummy process.

20. A computer program product comprising a non-transitory computer readable storage medium that stores code executable by a processor, the executable code comprising code to perform:
    detecting ambient light around an electronic device;
    determining whether a user is present based on a frequency component caused by a change of an intensity of ambient light; and
    controlling an operation of the electronic device in accordance with a result of the determination whether the user is present, comprising
        enabling a temperature monitoring control as a result of determining that the user is present, and
        disabling the temperature monitoring control as a result of determining that the user is not present.

* * * * *